United States Patent
Huang et al.

(10) Patent No.: US 8,628,988 B2
(45) Date of Patent: Jan. 14, 2014

(54) CONFORMAL METALLIZATION PROCESS FOR THE FABRICATION OF SEMICONDUCTOR LASER DEVICES

(75) Inventors: Jia-Sheng Huang, South Pasadena, CA (US); Phong Thai, Rowland Heights, CA (US)

(73) Assignee: Emcore Corporation, Albuquerque, NM (US)

( * ) Notice: Subject to any disclaimer, the term of this patent is extended or adjusted under 35 U.S.C. 154(b) by 106 days.

(21) Appl. No.: 13/333,493

(22) Filed: Dec. 21, 2011

(65) Prior Publication Data

US 2013/0163631 A1    Jun. 27, 2013

(51) Int. Cl.
| | |
|---|---|
| *H01L 21/18* | (2006.01) |
| *H01L 21/28* | (2006.01) |
| *H01L 21/8252* | (2006.01) |
| *H01S 5/028* | (2006.01) |
| *H01L 33/40* | (2010.01) |
| *H01L 33/44* | (2010.01) |

(52) U.S. Cl.
USPC .......... 438/39; 438/40; 438/46; 257/E33.063; 372/38.01; 372/49.01

(58) Field of Classification Search
USPC ................. 372/49.01, 38.01; 438/39, 40, 46; 257/E33.063
See application file for complete search history.

(56) References Cited

U.S. PATENT DOCUMENTS

| | | | | |
|---|---|---|---|---|
| 5,429,986 | A * | 7/1995 | Okada ........................... | 438/605 |
| 6,289,030 | B1 * | 9/2001 | Charles ...................... | 372/49.01 |
| 7,083,994 | B2 * | 8/2006 | O'Gorman ...................... | 438/29 |
| 7,382,813 | B2 * | 6/2008 | Kaneko ....................... | 372/46.01 |

OTHER PUBLICATIONS

Huang et al., "The effect of Cr barrier on interfacial reaction of Au/Zn/Au/Cr/Au contacts to p-type InGaAs/InP," *Thin Solid Films*, 2004; 446:132-137.
Huang et al., "Design-in reliability of modern distributed feedback (DFB) InP lasers: Can we meet up the stringent wavelength-division multiplex (WDM) requirement?" *IEEE Photonic Society—Summer Topical*, Jul. 18-20, 2011, Montreal, Quebec, Canada; 2 pgs.
Huang et al., "Ultra-High power, low RIN and narrow linewidth lasers for C-band DWDM +100km fiber optic link," *2011 IEEE Photonics Conference*, Arlington, VA; 2 pgs.
Huang et al., "A new degradation mechanism of distributed feedback (DFB) InP semiconductor lasers," *IEEE Photonics Society—Summer Topical 2012*, Seattle, WA; 2 pgs.

* cited by examiner

*Primary Examiner* — Mary Wilczewski (57) ABSTRACT

A method of fabricating a semiconductor laser device by forming a semiconductor structure at least part of which is in the form of a mesa structure having a flat top. The steps include depositing a passivation layer over the mesa structure, forming a contact opening in the passivation layer on the flat top of the mesa structure; and depositing a metal contact portion, with the deposited metal contact portion contacting the semiconductor structure via the contact opening. The contact opening formed through the passivation layer has a smaller area than the flat top of the mesa structure to allow for wider tolerances in alignment accuracy. The metal contact portion comprises a platinum layer between one or more gold layers to provide an effective barrier against Au diffusion into the semiconductor material.

20 Claims, 11 Drawing Sheets

CONFORMAL METALLIZATION PROCESS FOR THE FABRICATION OF SEMICONDUCTOR LASER DEVICES

BACKGROUND OF THE INVENTION

1. Field of the Invention

The present invention relates to the fabrication of a semiconductor laser device, and in particular to the formation of a metal contact forming part of the semiconductor laser device.

2. The Background Art

Semiconductor laser devices are widely available. One type of semiconductor laser device is tunable around the 1.5 µm wavelength for use in DWDM optical communications. Such semiconductor laser devices may be based on an InP semiconductor system.

One way of forming a p-metal contact on an InP semiconductor system is to deposit a lattice-matched InGaAs layer, followed by the deposition of layers of Titanium (Ti), Platinum (Pt) and Gold (Au) to form a so-called non-alloyed ohmic contact. The Au layer forms a contact pad, while the Pt layer acts as a barrier to inhibit diffusion of gold into the semiconductor structure. The article "Au/Pt/Ti contacts to p-$In_{0.53}Ga_{0.47}As$ and n-InP layers formed by a single metallization common step and rapid thermal processing" by A. Katz et al, J. Appl. Phys. 68 (3), 1 Aug. 1990, the whole contents of which are hereby incorporated by reference, discusses the formation of such a contact by evaporating the Au bonding layer during a single deposition process with the Ti and Pt layers, followed by rapid thermal processing.

Sudden failure is a problem which can afflict semiconductor laser devices. One cause of such sudden failure is Au migration into the InP material, particularly as Au migrates rapidly in InP material.

SUMMARY OF THE INVENTION

The present invention aims to prevent sudden failure of semiconductor laser devices by providing a more effective barrier between the metal contact pad and the semiconductor material.

One aspect of the present invention provides a method of fabricating a semiconductor laser device having a semiconductor structure in the form of a mesa structure having a substantially flat top. A passivation layer is deposited over the mesa structure, and then a contact opening is formed in the portion of the passivation layer on the flat top of the mesa structure. A metal contact portion is then formed in the contact opening. The area of the contact opening is made less than the area of the flat top of the mesa structure. In this way, small misalignments during the fabrication process do not result in the metallic layers of the contact being deposited on the side surfaces of the mesa structure, which the inventors have identified as an issue in the sudden failure of semiconductor laser devices.

Another aspect of the invention provides a semiconductor laser device having a mesa structure with a flat top. A metal contact portion is formed in an opening in the passivation layer on the flat top of the mesa structure. The area of the metal contact portion is less than that of the flat top of the mesa structure.

In an embodiment, a layer of platinum of at least 80 nanometers is provided between the semiconductor structure and one or more gold layers forming part of the metal contact portion. In this way, Au diffusion into the semiconductor structure is impeded.

In an embodiment, the metal contact portion is formed by depositing, in a single deposition process: a layer of titanium so as to contact the semiconductor substrate through the contact opening; then a layer of platinum; then a layer of gold; then a layer of chromium; and then a second layer of gold. In this way, the uniformity of the deposited layers is improved, thereby reducing the possibility of Au migration into the semiconductor material by virtue of an inhomogeneity in the deposited metal contact portion.

DESCRIPTION OF THE PREFERRED EMBODIMENT

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments nor the relative dimensions of the depicted elements, and are not drawn to scale.

Figure 1:
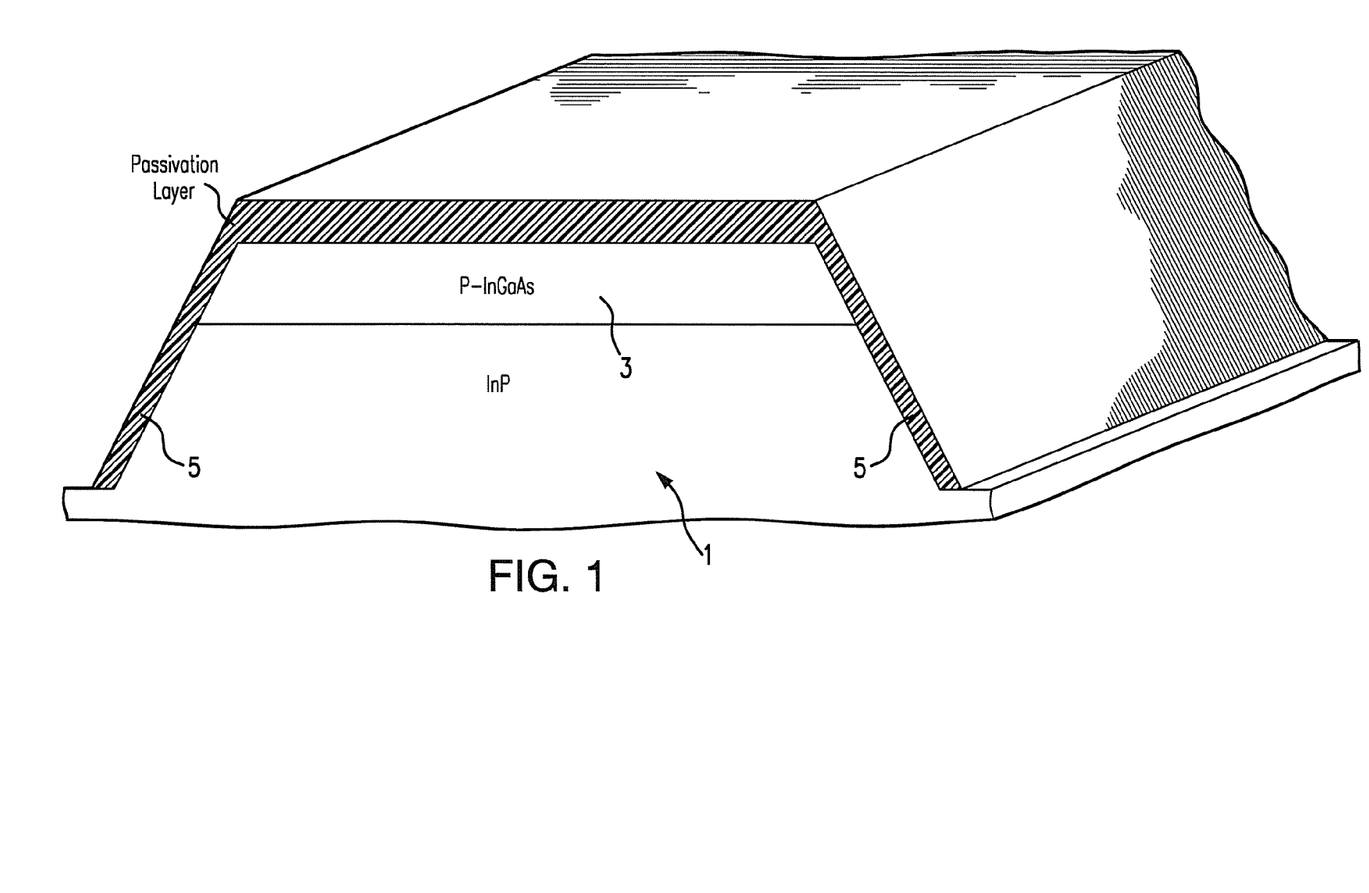
FIG. 1 is a schematic side view of a semiconductor laser device following the deposition of a passivation layer on a mesa-structure.

As shown in FIG. 1, in an embodiment of the present invention a mesa structure 1 forms part of a semiconductor laser device. In this embodiment, the semiconductor laser device is a tunable laser in the frequency region around 1.5 µm fabricated using an Indium Phosphide (InP) semiconductor system. In particular, the semiconductor laser device is formed by the deposition of lattice-matched layers on an InP substrate. FIGS. 1 to 11 schematically illustrate respective stages during a process to form a metal contact portion on the flat top of the mesa structure 1.

Initially, as shown in FIG. 1, a lattice-matched p-InGaAs layer 3 is deposited on top of the mesa-structure, and then a passivation layer 5 is formed over the mesa-structure 1. In this embodiment, the passivation layer 5 is formed by depositing a sequence of dielectric sublayers. More specifically, the passivation layer 5 is formed by depositing a 100 nm SINx dielectric layer followed by depositing a 150 nm $SiO_2$ dielectric layer.

Figure 2:
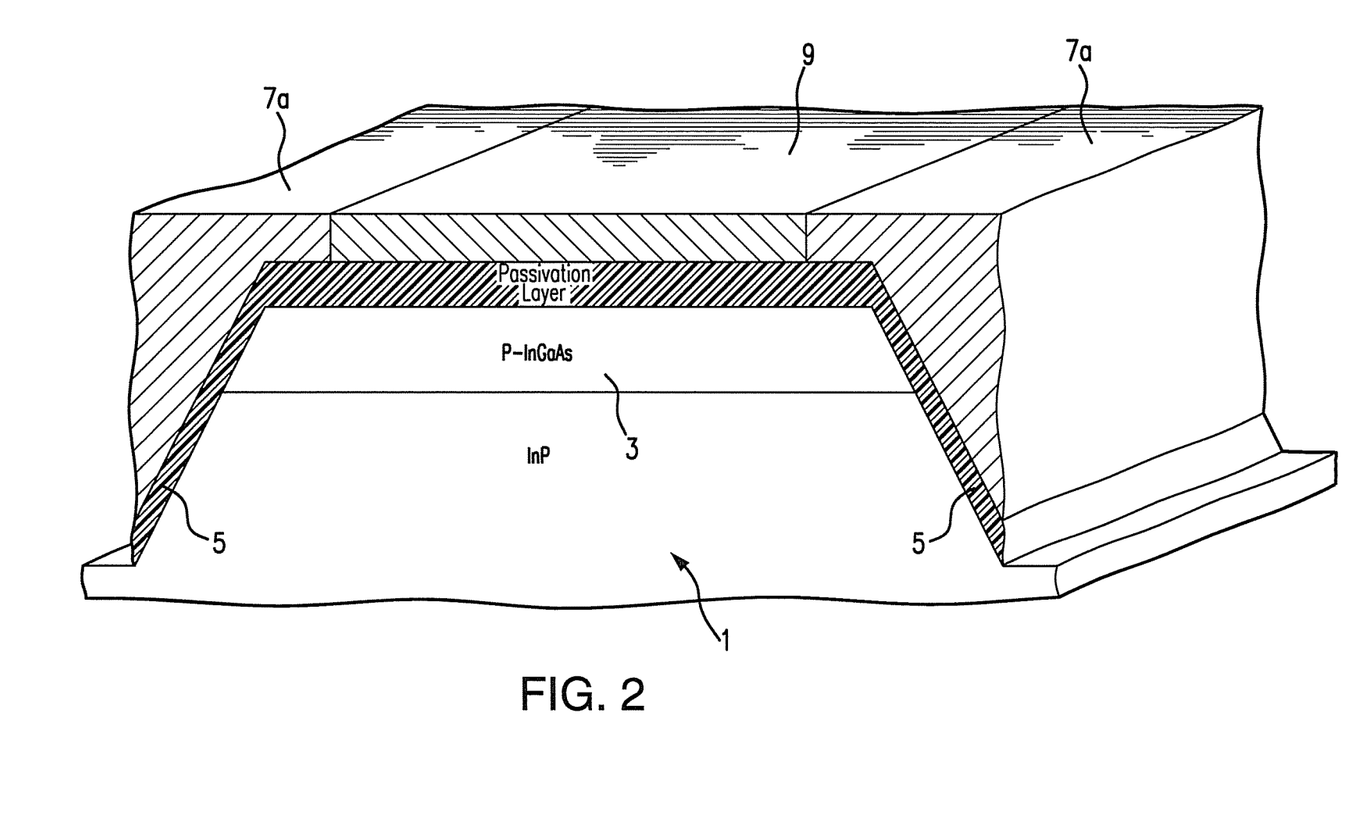
FIG. 2 is a schematic side view of a semiconductor laser device following the deposition and exposure of a photo-resist material on the semiconductor laser device of FIG. 1.

Turning to FIG. 2, next photo resist material 7a,7b, in this embodiment PR-1827 photo-resist, is deposited, followed by a spinning process at 4000 rpm and a pre-bake at 115° C. for 1 minute. A contact mask is then applied and the photo-resist material is exposed for 14 seconds to form an exposed region 9. As shown in FIG. 2, the area of the exposed region 9 is less than the area of the flat top of the mesa structure 1. Further, the exposed region 9 is generally centred at the centre of the flat top of the mesa structure 1, so that the sidewalls of the mesa structure 1 are not covered by the exposed region 9. It will be appreciated that by making the area of the exposed region 9 less than the area of the flat top of the mesa structure 1, misalignment during the exposure process is less likely to result in the exposed portion 9 extending over any sidewall of the mesa structure 1.

Figure 3:
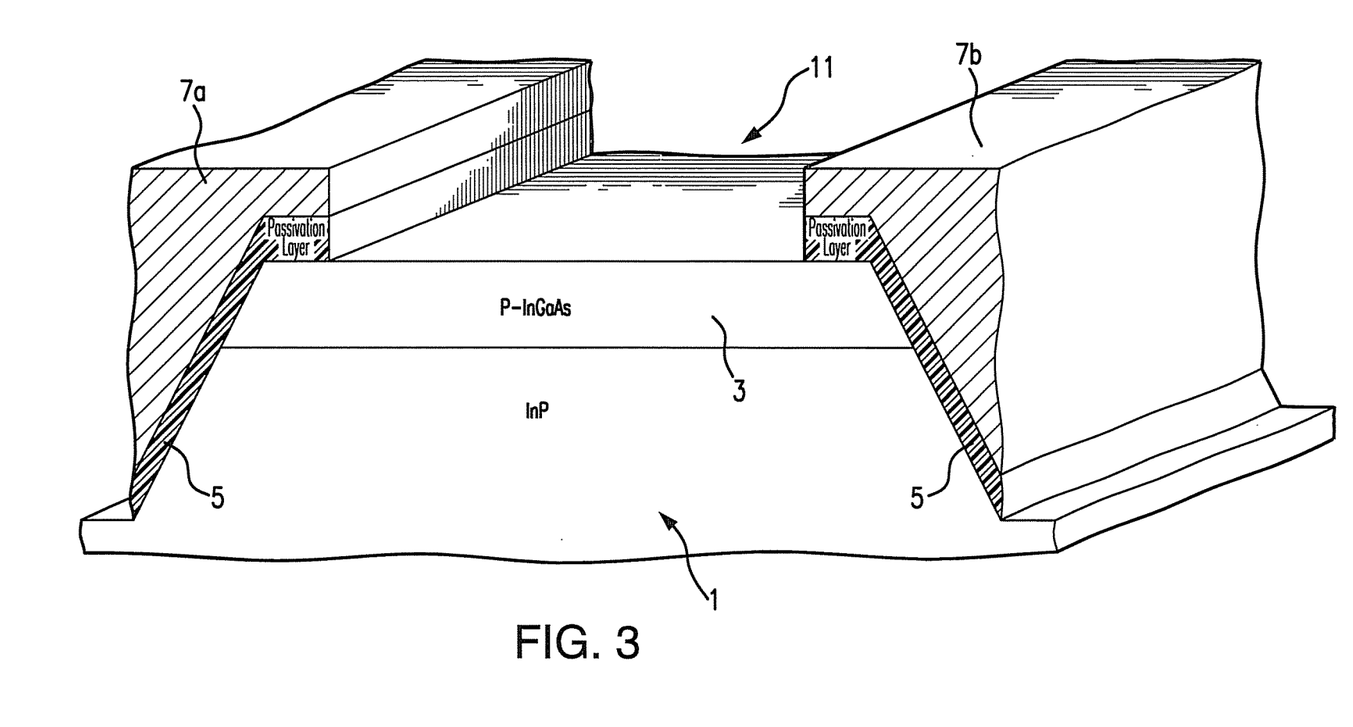
FIG. 3 is a schematic side view of a semiconductor laser device following an etching operation performed on the semiconductor laser device of FIG. 2.

With reference to FIG. 3, next an etching operation is performed to remove the exposed portion 9 of the photo-resist material and the portion of the passivation layer 5 covered by the exposed portion 9 of the photo-resist material. In this way, an opening is formed to a portion 11 of the p-InGaAs layer 3. In this embodiment, the exposed portion 9 is etched using MF319 developer, the $SiO_2$ dielectric material is etched using Sirius Reactive Ion Etchant (RIE) for one hundred seconds, and the SiNx dielectric material is etched using Branson RIE for thirty-five seconds.

Figure 4:
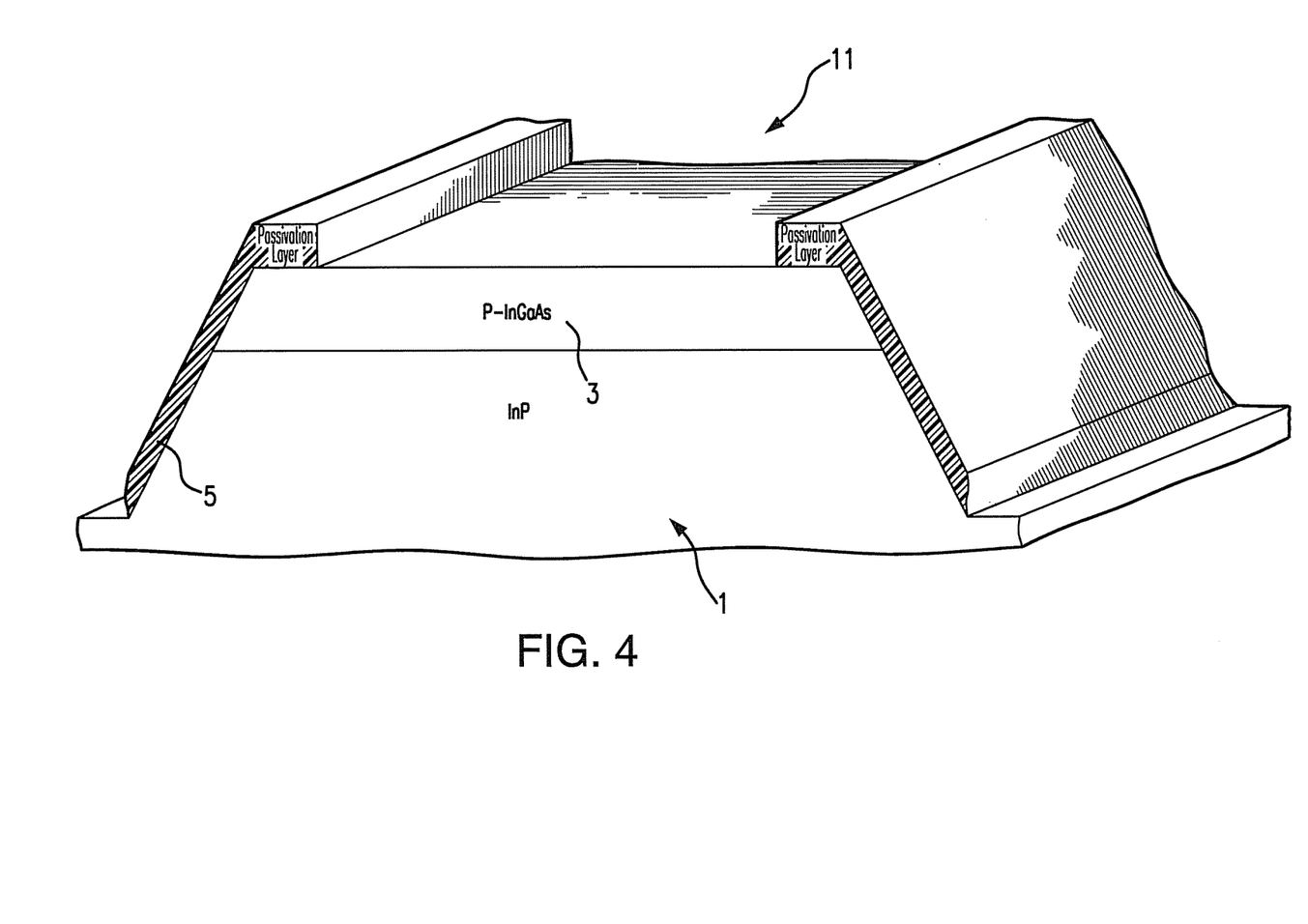
FIG. 4 is a schematic side view of a semiconductor laser device following the removal of the photo-resist material remaining on the semiconductor laser device of FIG. 3.

The remaining photo-resist material 7a,7b is then removed to form a semiconductor structure as shown in FIG. 4. In this embodiment, the remaining semiconductor material is removed using PRR1165 at 120° C. for five minutes, followed by rinsing with deionised water for two minutes.

Figure 5:
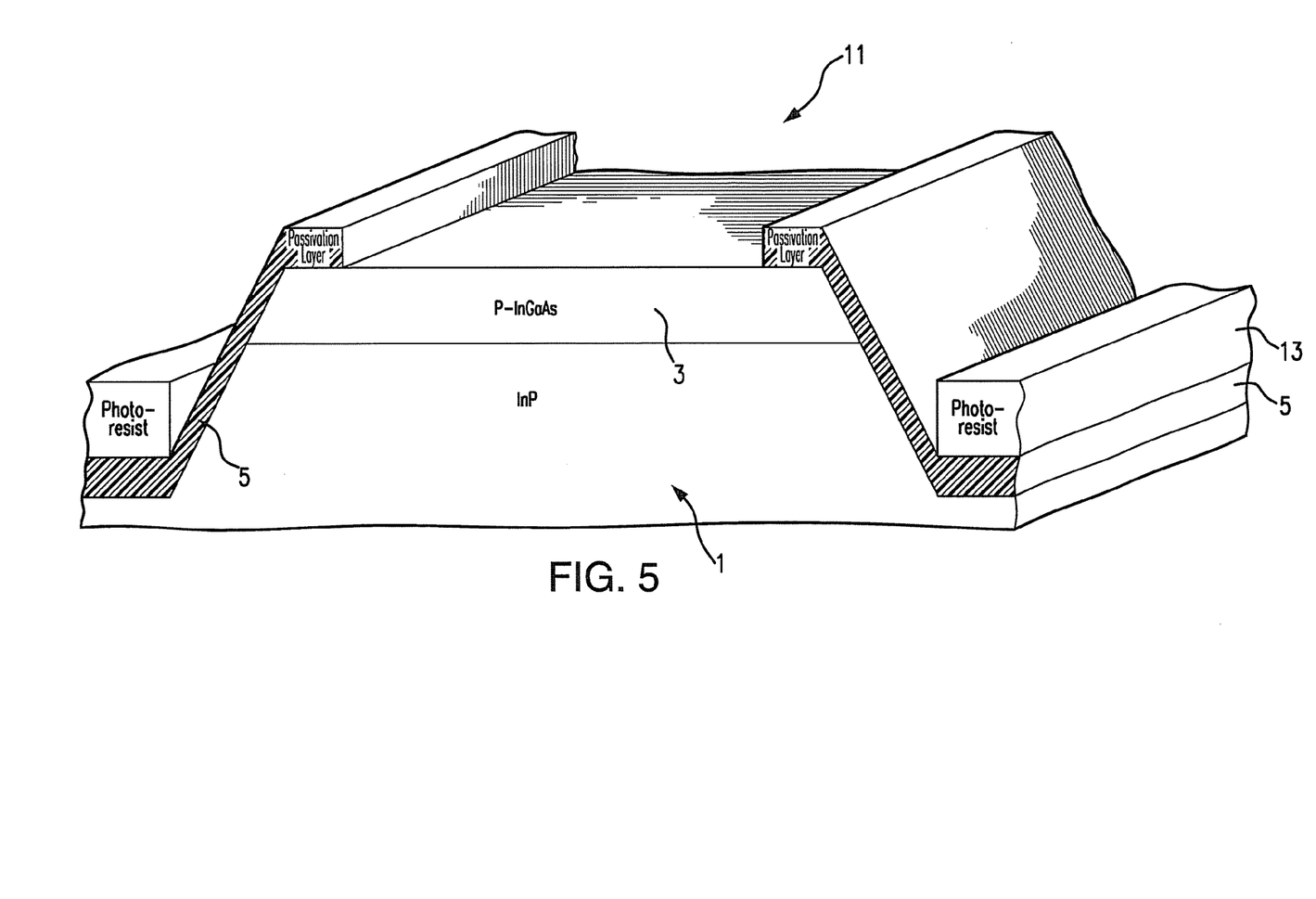
FIG. 5 is a schematic side view of a semiconductor laser device following the deposition, exposure and etching of a second photo-resist material on the semiconductor laser device of FIG. 4.

Next, a bondpad opening covering the mesa-structure 1 is formed by depositing lift-off photo-resist material, in this embodiment LOR-10A, and further photo-resist material, in this embodiment PR1811, spinning at 4000 rpm and baking at 115° C. for one minute. A mask is then applied to define the bondpad pattern, followed by an eight second exposure. The photo-resist resist is then etched, in this embodiment for five minutes using MF319 developer. As shown in FIG. 5, the bondpad pattern results in the mesa-structure being free from photo-resist material following etching, but the areas of the semiconductor laser device surrounding the mesa structure 1 being covered by photo-resist material 13.

Figure 9:
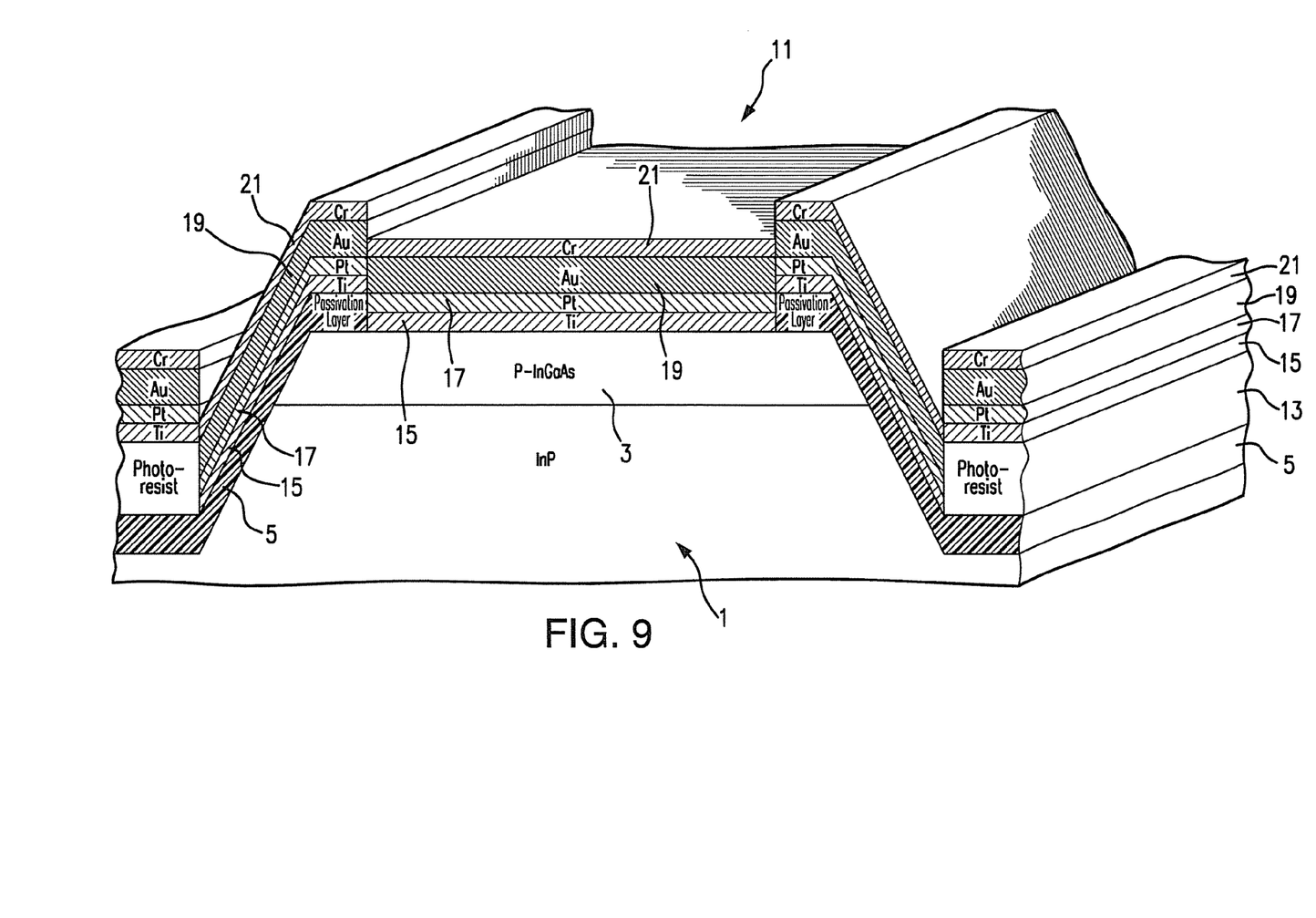
FIG. 9 is a schematic side view of a semiconductor laser device following the deposition of a Cr layer on the semiconductor laser device of FIG. 8.
Figure 10:
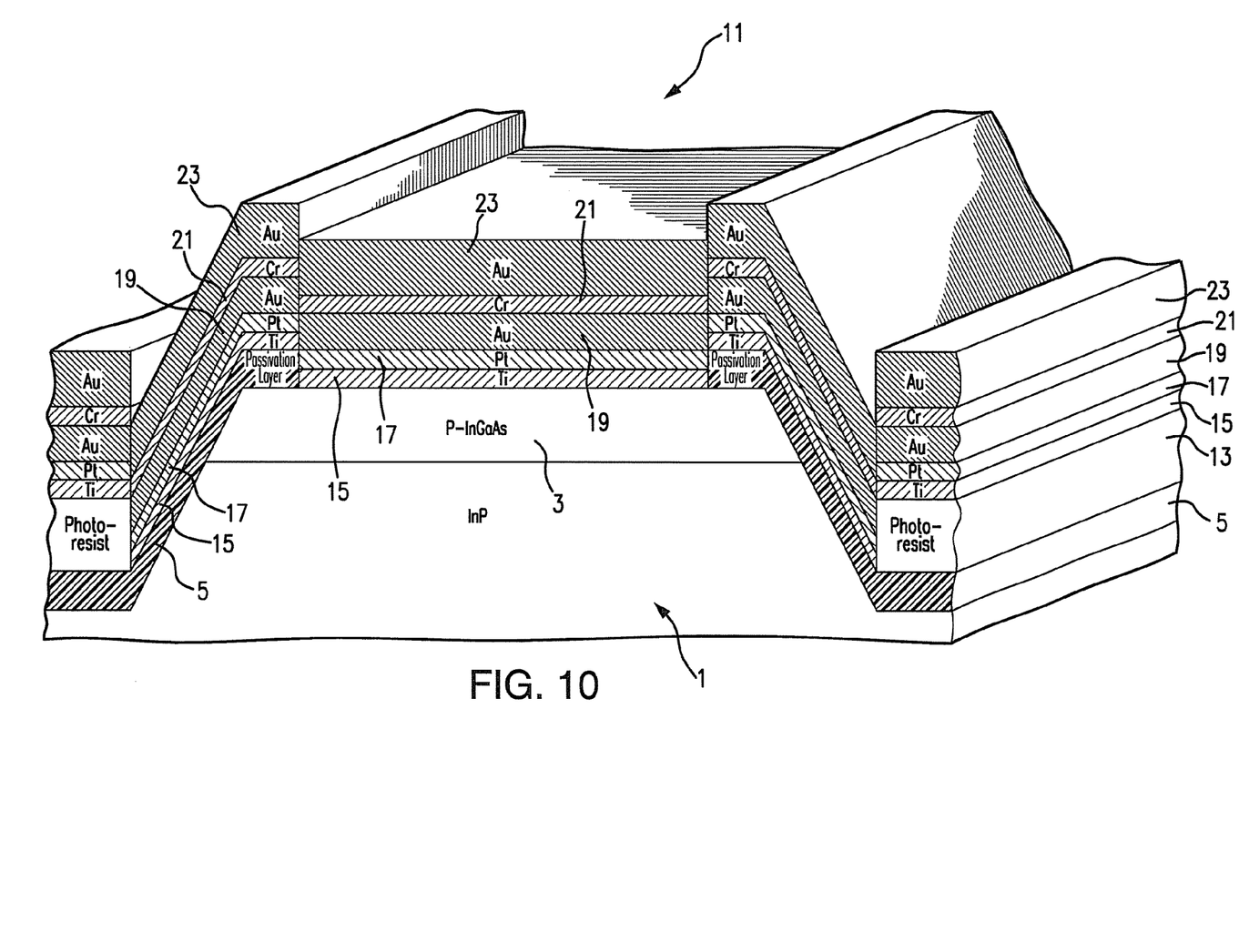
FIG. 10 is a schematic side view of a semiconductor laser device following the deposition of a second Au layer on the semiconductor laser device of FIG. 9.

There then follows a single deposition process in which:
a layer 15 of Titanium is deposited (see FIG. 6);
a layer 17 of Platinum is deposited on the Ti layer 17 (see FIG. 7);
a first layer 19 of Gold is deposited on the Pt layer 17 (see FIG. 8);
a layer of Chromium 21 is deposited on the first Au layer 19 (see FIG. 9); and
a second layer 23 of Gold is deposited on the Cr layer 21 (see FIG. 10).

Figure 6:
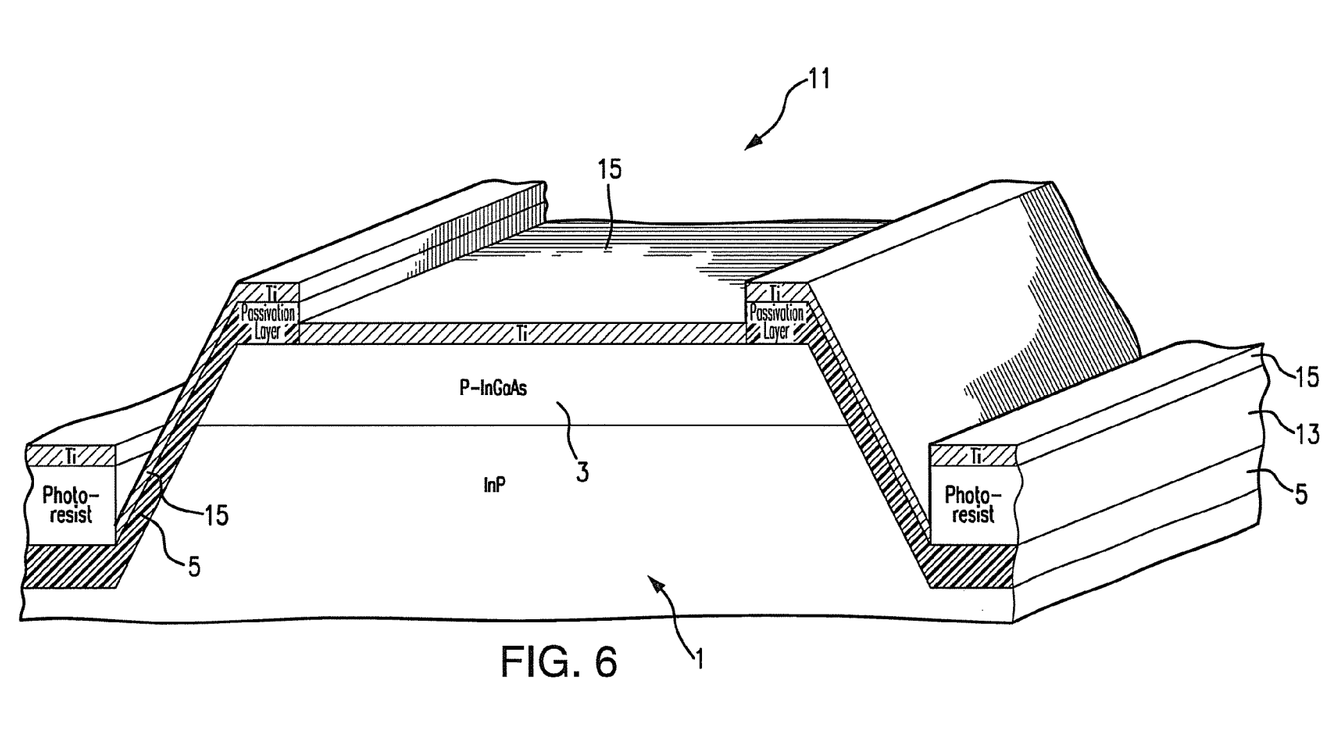
FIG. 6 is a schematic side view of a semiconductor laser device following the deposition of a Ti layer on the semiconductor laser device of FIG. 5.
Figure 7:
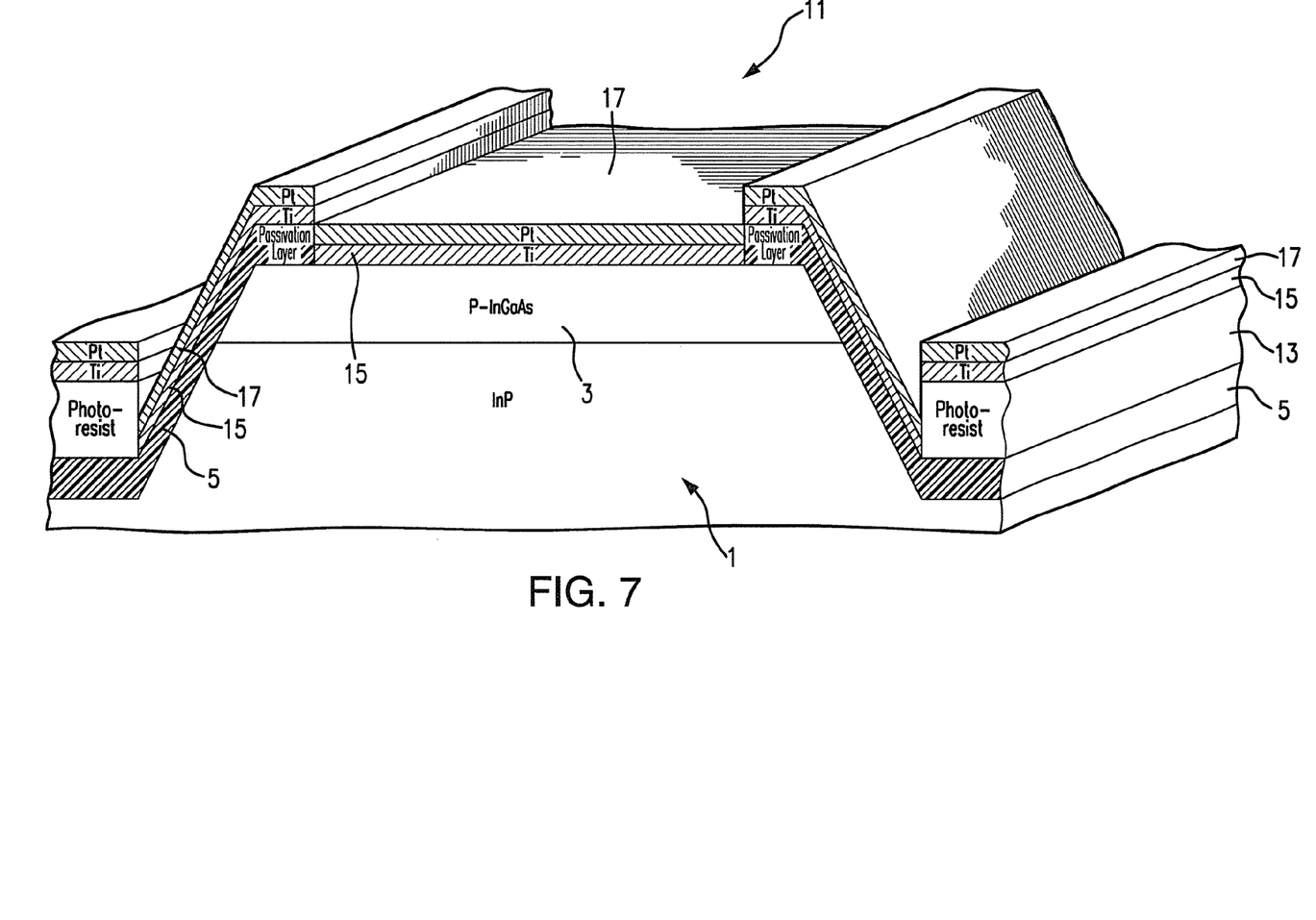
FIG. 7 is a schematic side view of a semiconductor laser device following the deposition of a Pt layer on the semiconductor laser device of FIG. 6.

In this embodiment, the Ti layer 15 has a thickness of 50 nm and the Pt layer 17 has a thickness of 80 nm. The thickness of the Pt layer 17 is more than normal to provide an improved barrier against Au migration into the semiconductor material.

Figure 8:
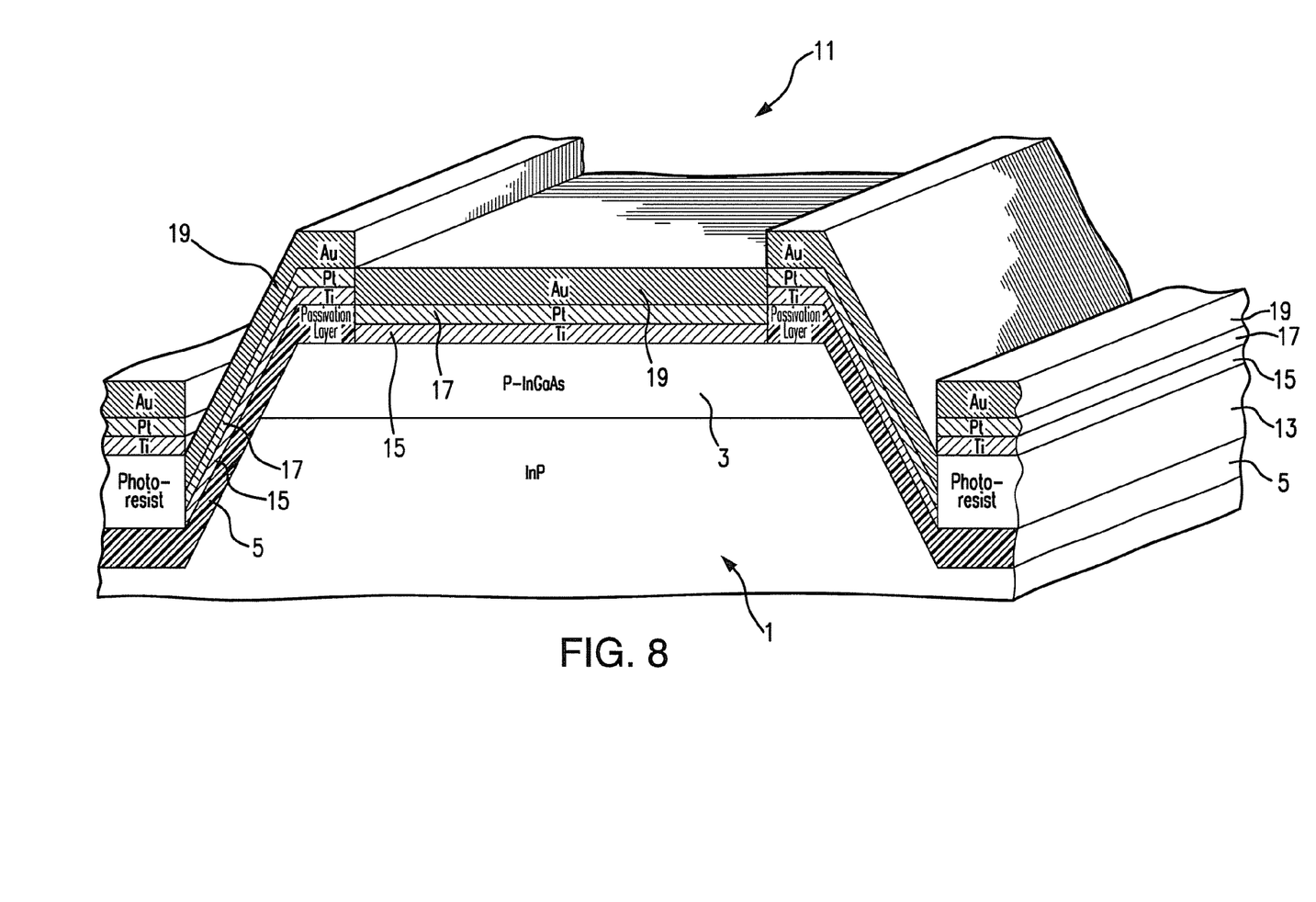
FIG. 8 is a schematic side view of a semiconductor laser device following the deposition of a first Au layer on the semiconductor laser device of FIG. 7.

In this embodiment, the thickness of the first Au layer 19 is 300 nm, the thickness of the Cr layer 21 is 15 nm and the thickness of the second Au layer 23 is 1200 nm. As discussed in the article "The effect of Cr barrier on interfacial reaction of Au/Zn/Au/Cr/Au contacts to p-type InGaAs/InP" by J. S. Huang and C. B. Vartuli, Thins Solid Films 446 (2004) 132-137, the whole contents of which are hereby incorporated by reference, the Cr layer 21 serves as an adhesion layer.

By depositing the Ti layer 15, Pt layer 17, first Au layer 19, Cr layer 21 and second Au layer 23 in a single deposition process, a more uniform deposition is obtained as processing operations performed between deposition processes can result in non-uniformity of the underlying layers for later deposition processes.

A lift-off process is then performed to remove the photo-resist material 13 and the metal layers formed thereon. In this embodiment the lift-off process uses PRR1165 for ten minutes at 120° C. Finally, an $O_2$ plasma clean is performed for five minutes.

Figure 11:
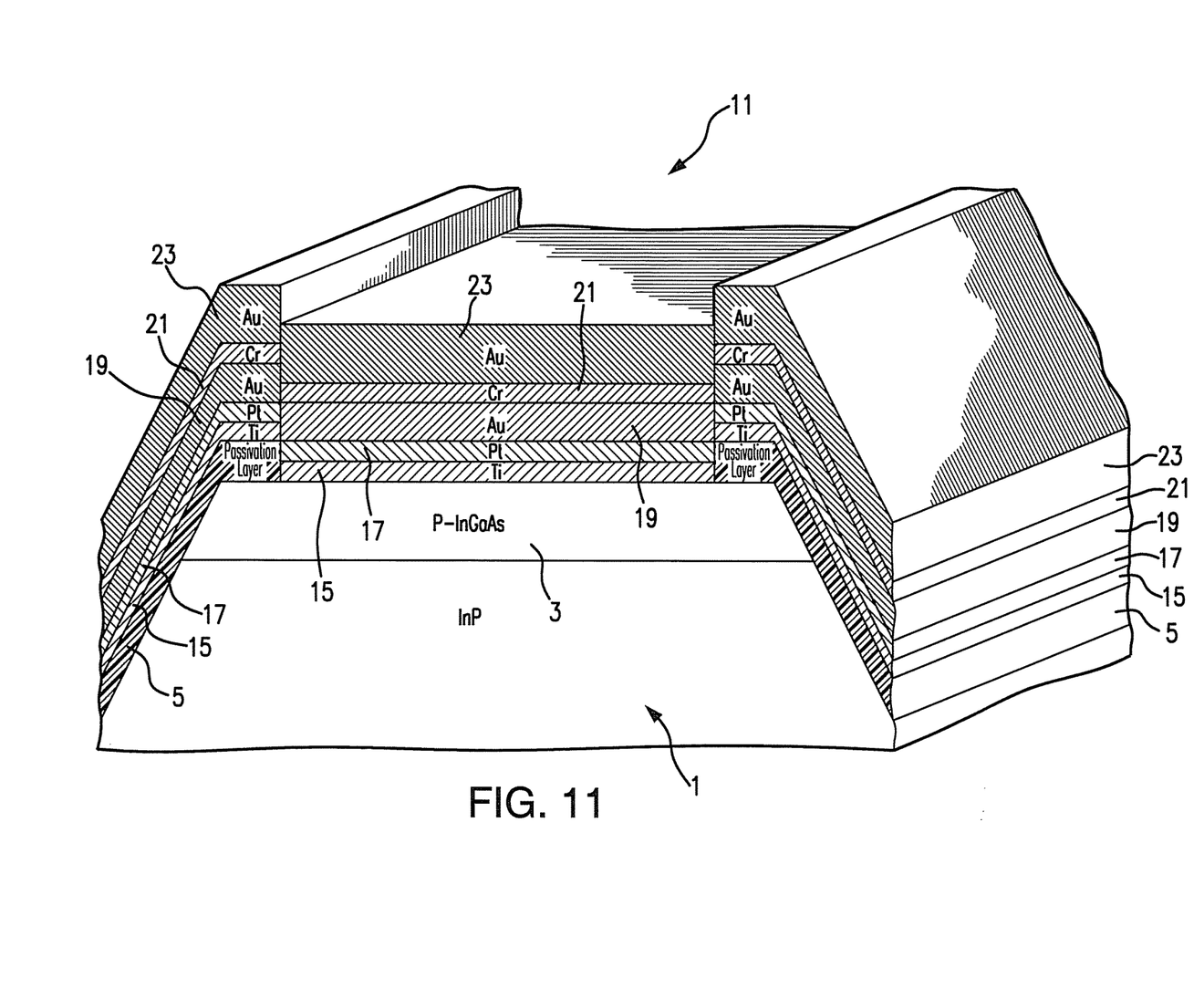
FIG. 11 is a schematic side view of a semiconductor laser device following a lift-off process performed on the semiconductor laser device of FIG. 10.

As shown in FIG. 11, the resulting semiconductor laser device has a mesa-structure 1 covered by a metal contact portion. The metal contact portion contacts the portion 11 of the p-InGaAs layer 3. By making the portion 11 smaller than the area of the top of the mesa structure 1, sensitivity to alignment is reduced. Further, by making the Pt layer 17 thicker than normal, a better barrier against Au diffusion is formed. In addition, by depositing the metal contact portion in a single deposition process, a more uniform laminar structure is formed.

It will be appreciated that the depth of the Pt layer 17 could be increased further to improve the barrier against Au diffusion into the semiconductor material still further.

The invention claimed is:

1. A method of fabricating a semiconductor laser device, the method comprising:
    forming a semiconductor structure at least part of which is in the form of a mesa structure having a flat top;
    depositing a passivation layer over the mesa structure;
    forming a contact opening in the passivation layer on the flat top of the mesa structure; and
    depositing a metal contact portion, with the deposited metal contact portion contacting the semiconductor structure via the contact opening,
    wherein the contact opening formed through the passivation layer has a smaller area than the flat top of the mesa structure, and
    wherein said depositing of a metal contact portion comprises:
        depositing a layer of titanium so that the layer of titanium is in contact with the semiconductor structure via the contact opening;
        depositing a layer of platinum on the titanium layer;
        depositing a first layer of gold on the platinum layer;
        depositing a layer of chromium on the first gold layer; and
        depositing a second layer of gold on the chromium layer.

2. The method of claim 1, wherein the forming of the contact opening in the passivation layer comprises:
    depositing a photo-resist layer over the passivation layer;
    masking and exposing the photo-resist layer;
    removing a portion of the photo-resist layer adjacent the flat top of the mesa structure; and
    removing a portion of the passivation layer via said removed portion of the photo-resist layer to form the contact opening, wherein said masking and exposing of the photo-resist layer is arranged so that said contact opening has a smaller area than the flat top of the mesa structure.

3. The method of claim 2, wherein the mesa structure is formed with sloping sidewalls and following said removal of a portion of the passivation layer, the passivation layer covers the sloping sidewalls and the periphery of the flat top of the mesa structure.

4. The method of claim 1, wherein the deposited platinum layer has a thickness of at least 80 nanometers.

5. The method of claim 4, wherein the titanium layer, the platinum layer, the first gold layer, the chromium layer and the second gold layer are deposited in a single deposition process.

6. The method of claim 5, wherein said forming a semiconductor structure comprises forming a mesa structure having p-doped semiconductor material at the flat top of the mesa structure.

7. The method of claim 6, wherein the p-doped semiconductor material is indium gallium arsenide.

8. The method of claim 7, wherein the semiconductor structure substrate is formed on an indium phosphide substrate.

9. A method of fabricating a semiconductor laser device, the method comprising:
   forming an indium phosphide semiconductor structure, at least part of which is in the form of a mesa structure having a flat top with a p-InGaAs layer formed adjacent the flat top;
   depositing a passivation layer over the mesa structure;
   depositing a photo-resist layer over the passivation layer;
   masking and exposing the photo-resist layer;
   removing a portion of the photo-resist layer adjacent the flat top of the mesa structure;
   removing a portion of the passivation layer via said removed portion of the photo-resist layer to define a contact opening, wherein said masking and exposing of the photo-resist layer is arranged so that said contact opening has a smaller area than the flat top of the mesa structure; and
   depositing a metal contact portion, with the deposited metal contact portion contacting the semiconductor structure via the contact opening, wherein the depositing of the metal contact portion comprises:
      depositing a layer of titanium so that the layer of titanium is in contact with the semiconductor structure via the contact opening;
      depositing a layer of platinum on the titanium layer, wherein the deposited platinum layer has a thickness of at least 80 nanometers;
      depositing a first layer of gold on the platinum layer;
      depositing a layer of chromium on the first gold layer; and
      depositing a second layer of gold on the chromium layer.

10. The method of claim 9, wherein the mesa structure is formed with sloping sidewalls and following said removal of a portion of the passivation layer, the passivation layer covers the sloping sidewalls and the periphery of the flat top of the mesa structure.

11. The method of claim 9, wherein the titanium layer, the platinum layer, the first gold layer, the chromium layer and the second gold layer are deposited in a single deposition process.

12. The method of claim 9 wherein the semiconductor structure is formed on the indium phosphide substrate by the deposition of lattice-matched layers.

13. The method of claim 9 wherein the passivation layer is formed by depositing a sequence of dielectric sublayers.

14. The method of claim 13 wherein the passivation layer is formed by depositing a $SiN_x$ dielectric layer followed by depositing a $SiO_2$ dielectric layer.

15. The method of claim 9 wherein the semiconductor laser device is a tunable laser in the frequency range around 1.5 μm.

16. A method of fabricating a semiconductor laser device, the method comprising:
   forming a semiconductor structure comprising lattice-matched layers, at least part of which is in the form of a mesa structure having a flat top;
   depositing a passivation layer over the mesa structure;
   forming a contact opening in the passivation layer on the flat top of the mesa structure; and
   depositing a metal contact portion, with the deposited metal contact portion contacting the semiconductor structure via the contact opening,
   wherein the contact opening formed through the passivation layer has a smaller area than the flat top of the mesa structure, and
   wherein said depositing of a metal contact portion comprises:
      depositing a layer of titanium so that the layer of titanium is in contact with the semiconductor structure via the contact opening;
      depositing a layer of platinum on the titanium layer;
      depositing a first layer of gold on the platinum layer;
      depositing a layer of chromium on the first gold layer; and
      depositing a second layer of gold on the chromium layer,
   wherein the semiconductor laser device is a tunable laser in the frequency range around 1.5 μm.

17. The method of claim 16, wherein the mesa structure is formed with sloping sidewalls and following said removal of a portion of the passivation layer, the passivation layer covers the sloping sidewalls and the periphery of the flat top of the mesa structure.

18. The method of claim 16, wherein the titanium layer, the platinum layer, the first gold layer, the chromium layer and the second gold layer are deposited in a single deposition process.

19. The method of claim 16 wherein the passivation layer is formed by depositing a sequence of dielectric sublayers.

20. The method of claim 19 wherein the passivation layer is formed by depositing a $SiN_x$ dielectric layer followed by depositing a $SiO_2$ dielectric layer.

* * * * *